United States Patent [19]

Reid

[11] 4,348,651

[45] Sep. 7, 1982

[54] CASCADING DIODE SWITCHES

[75] Inventor: Martin J. Reid, Chelmsford, Mass.

[73] Assignee: Alpha Industries, Inc., Woburn, Mass.

[21] Appl. No.: 229,975

[22] Filed: Jan. 30, 1981

[51] Int. Cl.$^3$ .................... H01P 1/15; H01P 11/00; H01P 3/08; H01L 21/98

[52] U.S. Cl. .................... 333/262; 29/577 C; 29/590; 29/591; 333/247; 357/51

[58] Field of Search .............. 333/246, 248, 258, 262, 333/156, 164, 33-35, 236, 238-240, 101, 103; 307/303; 29/576 R, 576 E, 576 C, 577 R, 589-591; 357/1-3, 13, 40, 51

[56] References Cited

U.S. PATENT DOCUMENTS

| | | | |
|---|---|---|---|
| 3,538,465 | 11/1970 | Manning, Jr. et al. | 333/258 X |
| 3,852,794 | 12/1974 | Pearson et al. | 333/258 X |
| 4,292,643 | 9/1981 | Kellner et al. | 333/247 X |

OTHER PUBLICATIONS

Fleming et al.-"GaAs SAMP Device for Ku-Band Switching", IEEE Trans. on Microwave Theory and Techniques, vol. MTT-27, No. 12, Dec. 1979; pp. 1032-1035.

*Primary Examiner*—Marvin L. Nussbaum
*Attorney, Agent, or Firm*—Charles Hieken

[57] ABSTRACT

An N or N+ type semiconductor substrate has a P-type layer diffused therein to form a PIN junction that is etched out between adjacent mesas and filled in with glass to form adjacent diodes between top and bottom surfaces of the substrate. The bottom surface is metallized. The top surface carries a conducting layer interconnecting the adjacent P-type portions of the mesas. This conducting layer has end portions connected to a respective diode of end width and length joined by an intermediate portion of intermediate width and length. The end width and length is less than that of the intermediate width and length, respectively, so that the end portions present an inductive reactance at microwave frequencies between a respective diode and the intermediate portion, and the intermediate portion forms a transmission line with the conducting layer on the bottom surface having a characteristic impedance of 50 ohms while that of the transmission lines formed by each end portion and the conducting layer on the bottom surface is substantially 100 ohms.

10 Claims, 3 Drawing Figures

CASCADING DIODE SWITCHES

The present invention relates in general to cascading diode switches and more particularly concerns novel structure and techniques for providing an integrated diode switch package that may be manufactured at a cost many times less than that of a comparable prior art package while providing more controllable electrical performance in a compact package.

A typical prior art microwave diode switching circuit comprises two or more discrete diodes interconnected by the series combination of a transmission line interconnecting responsive wires that present an inductance connected to a respective diode. Apart from the labor costs involved in assembling these switching packages, there are problems in maintaining control of the parameter values from package to package.

Accordingly, it is an important object of this invention to provide an improved microwave diode switching circuit.

It is another object of the invention to achieve the preceding object with a package that may be fabricated relatively inexpensively while maintaining parameter values within relatively close tolerances.

It is another object of the invention to achieve one or more of the preceding objects with techniques that facilitate manufacture in relatively large quantities.

It is another object of the invention to achieve one or more of the preceding objects with a compact physical package.

It is a further object of the invention to achieve one or more of the preceding objects while significantly reducing manufacturing costs.

According to the invention, there is a semiconductor substrate with adjacent diodes formed by a common region of one conductivity type and spaced regions of the opposite conductivity type. These latter regions are interconnected by a conducting layer having a relatively broad portion sandwiched between relatively narrow portions dimensioned so that the relatively narrow portions form with a conducting layer of the opposite substrate surface transmission lines having a characterisic impedance greater than that formed by the relatively broad intermediate conducting portion and function as an inductive reactance between the intermediate portion that functions as a transmission line furnishing a predetermined delay and a respective diode portion. Numerous other features, objects and advantages of the invention will become apparent from the following specification when read in connection with the accompanying drawing on which:

Figure 1:
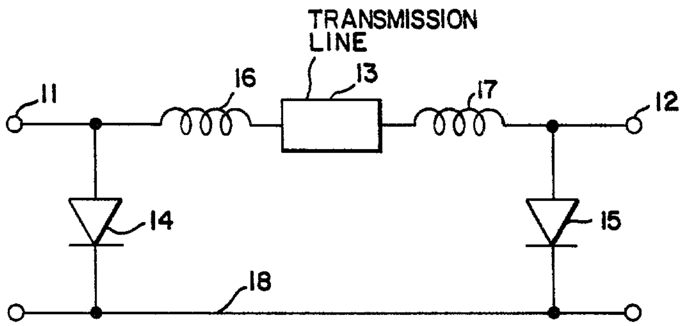
Fig. 1 PRIOR ART
FIG. 1 is a schematic circuit diagram of a switching circuit incorporating a pair of shunt diodes.

With reference now to the drawing, and more particularly FIG. 1 thereof, there is shown a schematic circuit diagram of a microwave switching circuit using a pair of shunt diodes. Transmission between terminals 11 and 12 at potentials referenced to a common or ground line 18 is controlled by the conducting state of diodes 14 and 15 whose anodes are interconnected by the series combination of inductances 16 and 17, respectively, and transmission line 13. the circuit allows and inhibits transmission when diodes 14 and 15 are nonconductive and conductive, respectively. The specific means for biasing the diodes (not shown) typically involves applying a biasing potential between each anode of diodes 14 and 15 and common line 18 through a microwave frequency choke. This choke typically may be connected to the ungrounded conductor of transmission line 13 to allow transmission when diodes 14 and 15 are rendered nonconductive by a negative potential and inhibit transmission when diodes 14 and 15 are rendered conductive by a positive potential. A typical prior art package embodying this circuit comprises separate microwave diodes having their cathodes connected to a grounded conducting surface and separated by a transmission line fomed by a block of insulating material separating conducting layers, one of which is connected to the grounded conducting surface to which the diode cathodes are connected. Each end of the ungrounded conducting layer is connected to a respective diode anode by a wire that functions as respective inductances 16 and 17. These prior art packages were assembled by taking separate diode chips and bonding wires or ribbons to form the circuit of FIG. 1. It is costly to assemble these prior art packages and maintain prescribed tolerances.

Figure 2:
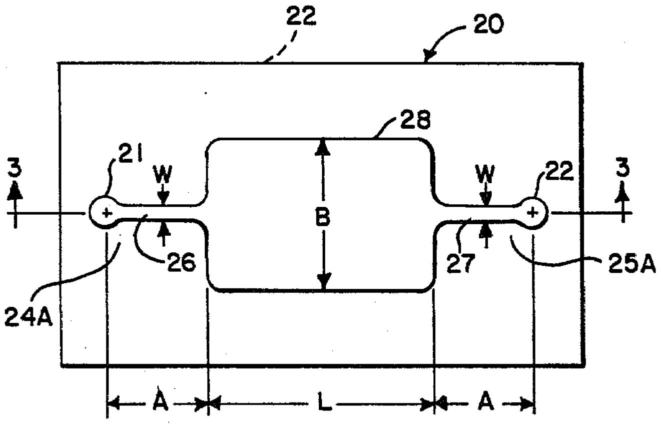
FIG. 2 is a plan view of an embodiment of the invention.

Referring to FIG. 2, there is shown a plan view of an embodiment of the invention which effectively embodies the circuit of FIG. 1, but in a compact package that is significantly less expensive to manufacture while maintaining close tolerances for parameter values. The invention comprises a semiconductor substrate 20 with a conducting layer on the top surface. This layer defines terminals 21 and 22 connected to anodes 24A and 25A, respectively, of diodes formed by the diffusion of P (or N) material into I region of the N (or P) substrate in accordance with conventional techniques, respective end inductive portions 26 and 27 of length A and width W interconnected by an intermediate portion 28 of width B and length L. These portions coact with the N (or P) layer on the bottom of the substrate 20 to form respective transmission line portions. The characteristic impedance of the line comprising intermediate portion 28 is typically 50 ohms while that comprising inductive portions 26 and 27 is typically 100 ohms. The length A of each of the latter is sufficiently small compared to a quarter wavelength at the microwave frequencies being switched that each presents an inductive reactance between a respective terminal 21 and 22 and the intermediate portion 28.

Figure 3:
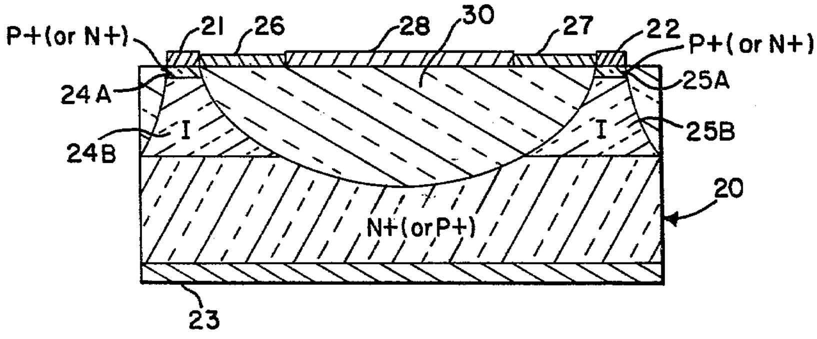
FIG. 3 is a view through section 3—3 of FIG. 2.

Referring to FIG. 3, there is shown a view through section 3—3 of FIG. 2. The techniques for forming the diodes are well known. Typically a P (or N) layer is diffused into the I region of substrate 20, and the region between anodes 24A and 25A etched out and filled with glass 30, or other suitable insulating material. The layer of conducting material shown in FIG. 2 is deposited using conventional metalization techniques and delineated using conventional masking techniques. The bottom is then metallized to form conducting layer 23.

The resultant package is stable, compact and in a convenient form for installation into microwave systems. The assembly may be incorporated directly into microwave systems without additional packaging. Alternatively, the chip may be packaged with a choke connected to a biasing terminal and coaxial or other microwave connectors. While this specific example has shown only two intercoupled diodes, it is within the principles of the invention to cascade as many as are desired.

There has been described novel apparatus and techniques for intercoupling microwave switching diodes to form a switching package in compact form that may be produced in large and small quantities at significantly reduced cost while maintaining desired tolerances. It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

I claim:

1. Microwave switching apparatus comprising, a semiconductor substrate formed with at least first and second diodes between top and bottom surfaces, first and second conducting portions on opposed surfaces of said substrate, said first conducting portion interconnecting regions of like conductivity type of said first and second diodes and having like end portions of end width and length interconnected by an intermediate portion of intermediate width and length, said end width being less than said intermediate width, said end length being sufficiently less than a quarter wavelength of microwave energy to be selectively transmitted so that each end portion presents an inductive reactance between a respective one of said diode portions and said intermediate portion, said intermediate portion coacting with said second conducting portion to form a transmission line having a characteristic impedance less than that of the transmission line portion formed by each end portion with said second conducting portion.

2. Microwave switching apparatus in accordance with claim 1 wherein said first and second diodes are mesa diodes having rectifying junctions separated by insulating material filling the region between the latter junctions and the mesas and supporting at least most of said first conducting portion.

3. Microwave switching apparatus in accordance with claim 2 wherein said insulating material is glass.

4. Microwave switching apparatus in accordance with claim 2 wherein the characteristic impedance of the transmission line comprising said intermediate portion has a characteristic impedance substantially half that of the transmission line comprising said end portions.

5. Microwave switching apparatus in accordance with claim 4 wherein the characteristic impedance of the transmission line comprising said intermediate portion is substantially 50 ohms.

6. Microwave switching apparatus in accordance with claim 2 wherein said semiconductor substrate has a P-type layer formed therein to form a PIN junction that is etched out between said adjacent mesas and filled in with said insulating material to form said adjacent mesa diodes between said top and bottom surfaces.

7. Microwave switching apparatus in accordance with claim 6 wherein said insulating material is glass.

8. A method of making the microwave switching apparatus of claim 1 which method includes the steps of, forming a P-type layer into said substrate to form a PIN junction between said top and bottom surfaces, etching out the region between said adjacent mesas, filling the etched-out region between said adjacent mesas with insulating material, depositing said first conducting portion upon said top surface with masking techniques, and metallizing said bottom surface to form said second conducting portion.

9. A method of making the microwave switching apparatus of claim 1 which method includes the steps of, forming N-type layer into said substrate to form a NIP junction between said top and bottom surfaces, etching out the region between said adjacent mesas, filling the etched-out region between said adjacent mesas with insulating material, depositing said first conducting portion upon said top surface with masking techniques, and metallizing said bottom surface to form said second conducting portion.

10. Microwave switching apparatus in accordance with claim 2 wherein said semiconductor substrate has a N-type layer formed therein to form a NIP junction that is etched out between said adjacent mesas and filled in with said insulating material to form said adjacent mesa diodes between said top and bottom surfaces.

* * * * *